US008895162B2

(12) United States Patent
Nishiyama et al.

(10) Patent No.: US 8,895,162 B2
(45) Date of Patent: *Nov. 25, 2014

(54) MAGNETORESISTIVE ELEMENT AND MAGNETIC MEMORY

(75) Inventors: Katsuya Nishiyama, Yokohama (JP); Wu Feng, Sendai (JP); Chunlan Feng, legal representative, Sendai (JP); Shigemi Mizukami, Sendai (JP); Terunobu Miyazaki, Sendai (JP); Hiroaki Yoda, Sagamihara (JP); Tadashi Kai, Tokyo (JP); Tatsuya Kishi, Yokohama (JP); Daisuke Watanabe, Sendai (JP); Mikihiko Oogane, Sendai (JP); Yasuo Ando, Sendai (JP); Masatoshi Yoshikawa, Yokohama (JP); Toshihiko Nagase, Yokohama (JP); Eiji Kitagawa, Yokohama (JP); Tadaomi Daibou, Kawasaki (JP); Makoto Nagamine, Tokyo (JP)

(73) Assignees: Kabushiki Kaisha Toshiba, Tokyo (JP); National University Corporation Tohoku University, Sendai-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/236,028

(22) Filed: Sep. 19, 2011

(65) Prior Publication Data
US 2012/0088125 A1  Apr. 12, 2012

Related U.S. Application Data

(63) Continuation of application No. PCT/JP2010/053611, filed on Mar. 5, 2010.

(30) Foreign Application Priority Data

Mar. 27, 2009 (JP) ................................. 2009-079633

(51) Int. Cl.
*G01R 33/09*   (2006.01)
(Continued)

(52) U.S. Cl.
CPC .............. *H01L 27/228* (2013.01); *H01L 43/08* (2013.01); *H01F 10/329* (2013.01);
(Continued)

(58) Field of Classification Search
None
See application file for complete search history.

(56) References Cited

U.S. PATENT DOCUMENTS 6,256,223 B1   7/2001   Sun
7,522,388 B2   4/2009   Miyazawa et al.
(Continued)

FOREIGN PATENT DOCUMENTS

JP   2005-203422 A   7/2005
JP   2006-80287 A   3/2006
(Continued)

OTHER PUBLICATIONS

Wang, K., Chinchore, A., Lin, W., Ingram, D., Smith, A., Hauser, A., and Yang, F., J. Cry. Gro., 311 (2009), 2265-2268.*
(Continued)

*Primary Examiner* — Kevin Bernatz
(74) *Attorney, Agent, or Firm* — Oblon, Spivak, McClelland, Maier & Neustadt, L.L.P.

(57) ABSTRACT

A magnetoresistive element according to an embodiment includes: a base layer; a first magnetic layer formed on the base layer and having a changeable magnetization direction with an easy axis of magnetization in a direction perpendicular to a film plane; a first nonmagnetic layer formed on the first magnetic layer; and a second magnetic layer formed on the first nonmagnetic layer and having a fixed magnetization layer with an easy axis of magnetization in a direction perpendicular to the film plane. The first magnetic layer includes a ferrimagnetic layer having a $DO_{22}$ structure or an $L1_0$ structure, the ferrimagnetic layer has a c-axis oriented in a direction perpendicular to the film plane, and the magnetization direction of the first magnetic layer is changeable by a current flowing through the first magnetic layer, the first nonmagnetic layer, and the second magnetic layer.

7 Claims, 13 Drawing Sheets

(51) Int. Cl.
  *H01L 43/08* (2006.01)
  *H01F 10/32* (2006.01)
  *H01L 43/10* (2006.01)
  *H01F 10/193* (2006.01)
  *G11C 11/16* (2006.01)
  *H01L 27/22* (2006.01)
  *B82Y 25/00* (2011.01)
  *H01F 10/28* (2006.01)

(52) U.S. Cl.
  CPC .............. *H01L 43/10* (2013.01); *H01F 10/28* (2013.01); *H01F 10/3272* (2013.01); *H01F 10/3254* (2013.01); *H01F 10/1936* (2013.01); *G11C 11/16* (2013.01); *H01F 10/3286* (2013.01); *G01R 33/09* (2013.01); *B82Y 25/00* (2013.01)
  USPC .................. 428/811.2; 428/811.5; 360/324.1

(56) References Cited

U.S. PATENT DOCUMENTS

| | | | |
|---|---|---|---|
| 7,663,197 | B2 | 2/2010 | Nagase et al. |
| 8,036,025 | B2 | 10/2011 | Nagase et al. |
| 8,218,355 | B2 * | 7/2012 | Kitagawa et al. ............. 365/158 |
| 8,363,462 | B2 | 1/2013 | Nagase et al. |
| 8,520,433 | B1 * | 8/2013 | Kato et al. .................... 365/171 |
| 8,680,633 | B1 * | 3/2014 | Kato et al. .................... 257/425 |
| 2003/0030946 | A1 * | 2/2003 | Hasegawa ................ 360/324.11 |
| 2005/0152075 | A1 | 7/2005 | Miyazawa et al. |
| 2007/0086121 | A1 | 4/2007 | Nagase et al. |
| 2008/0253174 | A1 * | 10/2008 | Yoshikawa et al. ........... 365/158 |
| 2009/0079018 | A1 * | 3/2009 | Nagase et al. ................ 257/421 |
| 2010/0118600 | A1 | 5/2010 | Nagase et al. |
| 2011/0170341 | A1 * | 7/2011 | Butler .......................... 365/171 |
| 2012/0008381 | A1 | 1/2012 | Nagase et al. |
| 2012/0241881 | A1 * | 9/2012 | Daibou et al. ................ 257/421 |

FOREIGN PATENT DOCUMENTS

| | | |
|---|---|---|
| JP | 2007-142364 A | 6/2007 |
| JP | 2008-252037 | 10/2008 |

OTHER PUBLICATIONS

Wang., K., Chinchore, A., Lin, W., Smith, A., and Sun, K., Mater. Res. Soc. Symp. Proc., vol. 1118 (2009).*
International Search Report issued Jun. 8, 2010 in PCT/JP2010/053611 filed Mar. 5, 2010.
J.C. Slonczewski, "Current-driven excitation of magnetic multilayers", Journal of Magnetism and Magnetic Materials 159, 1996, pp. L1-L7.
F. Wu, et al., "Magnetic and electrical transport properties of $Mn_{2.5}Ga$ films", Dec. 4, 2008, 2 pages.
Feng Wu, et al., "Epitaxial $Mn_{2.5}Ga$ thin films with giant perpendicular magnetic anisotropy for spintronic devices", Applied Physics Letters 94, 122503-1-122503-3, 2009, 3 pages.
International Preliminary Report on Patenetability with written opinion issued Nov. 24, 2011, in International application No. PCT/JP2010/053611 (English translation).
U.S. Appl. No. 13/623,405, filed Sep. 20, 2012, Kato, et al.
Office Action issued Oct. 18, 2013 in Japanese Patent Application No. 2009-079633 (with English language translation).
Office Action issued Jul. 19, 2013 in Japanese Patent Application No. 2009-079633 (with English language translation).

* cited by examiner

MAGNETORESISTIVE ELEMENT AND MAGNETIC MEMORY

CROSS-REFERENCE TO RELATED APPLICATION

This application is based upon and claims the benefit of priority from prior Japanese Patent Application No. 2009-79633 filed on Mar. 27, 2009 in Japan and PCT/JP 2010/053611 filed on Mar. 5, 2010, the entire contents of which are incorporated herein by reference.

FIELD

Embodiments described herein relate generally to a magnetoresistive element and a magnetic memory using the magnetoresistive element as a memory cell.

BACKGROUND

In recent years, there has been increasing interest in magnetic random access memories (hereinafter also referred to as MRAMs) using the magnetoresistive effect of ferromagnetic materials as the next-generation solid-state nonmagnetic memories that are capable of high-speed reading and writing, and performing large-capacity operations with smaller power consumptions. Particularly, magnetoresistive elements having magnetic tunnel junctions have been attracting increasing attention, since the high magnetoresistance ratios of such elements were discovered.

The fundamental structure of a magnetic tunnel junction is a three-layer stacked structure formed by stacking a storage layer having a changeable magnetization direction, an insulating layer, and a fixed layer that is located on the opposite side from the storage layer and maintains a predetermined magnetization direction. When a current flows into such a magnetic tunnel junction, the flowing current tunnels through the insulating layer. At this point, the resistance of the junction varies in accordance with the relative angle between the magnetization directions of the storage layer and the fixed layer. The resistance of the junction becomes smallest when the magnetization directions are parallel to each other, and becomes largest when the magnetization directions are antiparallel to each other. The variation in resistance is called a tunneling magnetoresistance effect (hereinafter also referred to as the TMR effect). Where a magnetoresistance element having a magnetic tunnel junction is actually used as a memory cell, the parallel state and the antiparallel state of the magnetization directions of the storage layer and the fixed layer (or the minimum resistance and the maximum resistance) are associated with binary information "0" or "1", to store information.

To perform writing on the memory of a magnetoresistive element, a known magnetic-field write method is used. By this method, a write wire is placed in the vicinity of a memory cell, and only the magnetization direction of the storage layer is reversed by the current magnetic field generated when a current is applied to the write wire. However, if the device size is made smaller so as to realize a large-capacity memory, the coercive force $H_c$ of the magnetic material forming the storage layer becomes larger in principle. Therefore, the current required for writing tends to become larger as the device is made smaller. On the other hand, the current magnetic field generated from the write wire becomes smaller in principle with a reduction in cell size. Therefore, by the magnetic-field write method, it is difficult to achieve both a reduction in cell size and a reduction in write current as required in a large-capacity design.

Meanwhile, as a write method to overcome the above problem, a write method (a spin-injection write method) using a spin momentum transfer (SMT) has been recently suggested. By this method, a spin-polarized current is applied to a magnetoresistive element, so as to reverse the magnetization direction of the storage layer. As the volume of the magnetic layer forming the storage layer becomes smaller, the amount of spin-polarized electrons can be made smaller. Therefore, this method is expected to be the write method for realizing a smaller device size and a lower current at the same time.

However, if the device is made smaller to achieve a larger capacity, the energy barrier or the magnetic anisotropy energy for maintaining the magnetization direction of the storage layer in one direction becomes smaller than the thermal energy. As a result, the magnetization direction of the magnetic material fluctuates (thermal disturbance), and the stored information can no longer be maintained.

In general, the energy barrier required for reversing a magnetization direction is expressed by the product of the magnetic anisotropy constant (the magnetic anisotropy energy per unit volume) and activation volume. Therefore, to secure a sufficient resistance to thermal disturbance in a minute device size area, it is necessary to select a material having a large magnetic anisotropy constant. The structures of in-plane magnetization types that have been studied so far normally use shape magnetic anisotropies. In such cases, to increase the magnetic anisotropy energy, methods need to be taken, such as increasing the aspect ratio of the magnetoresistive element, increasing the film thickness of the storage layer, and increasing the saturation magnetization of the storage layer. However, with the characteristics of spin-injection methods being taken into consideration, any of those methods leads to an increase in switching current, and is not suitable for miniaturization.

A material having a large magnetic crystalline anisotropy, instead of a shape magnetic anisotropy may be used. In that case, the easy axis of magnetization in the in-plane direction is distributed in the film plane. Therefore, the MR ratio (magnetoresistance ratio) becomes lower, or incoherent precessional motion is induced. As a result, the switching current increases. Therefore, this method is not preferable either. In a structure of an in-plane magnetization type, a magnetic anisotropy depending on the shape is used, and the switching current is sensitive to the shape. As a result, there is a possibility that the variation in the switching current increases as the structure becomes smaller.

On the other hand, a so-called perpendicular magnetization film having an easy axis of magnetization in a direction perpendicular to the film plane may be used as the ferromagnetic material forming a magnetoresistive element. When a magnetic crystalline anisotropy is used in a structure of a perpendicular magnetization type, shape anisotropies are not used. Therefore, the device shape can be made smaller than that of a device of an in-plane magnetization type. Further, the variation of the easy magnetization direction can be made smaller. Accordingly, by using a material having a large magnetic crystalline anisotropy, a smaller size and a lower current can be realized at the same time while a resistance to thermal disturbance is maintained.

Examples of materials to be used as perpendicular magnetization films include $L1_0$-ordered alloys (such as FePt and CoPt), artificial alloys (such as Co/Pt and Pd), hcp materials (such as CoPt), and RE-TM materials (such as Tb—CoFe).

As known generally, the switching current for reversing magnetization by a spin-injection method normally depends on the saturation magnetization $M_s$ and magnetic damping constant $\alpha$ of the storage layer. Therefore, to reverse the magnetization of the storage layer by a spin injection with a low current, it is critical to reduce the saturation magnetization Ms and the magnetic relaxation constant $\alpha$. Further, a magnetoresistive element needs to endure the processing temperature as a device. However, none of the above described perpendicular magnetization films satisfy all the above characteristics required in the storage layer.

DETAILED DESCRIPTION

Figure 1:
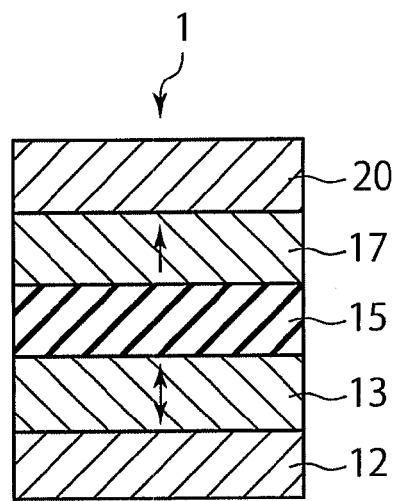
FIG. 1 is a cross-sectional view of a MR element according to a first embodiment.

A magnetoresistive element according to an embodiment includes: a base layer; a first magnetic layer formed on the base layer and having a changeable magnetization direction with an easy axis of magnetization in a direction perpendicular to a film plane; a first nonmagnetic layer formed on the first magnetic layer; and a second magnetic layer formed on the first nonmagnetic layer and having a fixed magnetization layer with an easy axis of magnetization in a direction perpendicular to the film plane. The first magnetic layer includes a ferrimagnetic layer having a $DO_{22}$ structure or an $L1_0$ structure, the ferrimagnetic layer has a c-axis oriented in a direction perpendicular to the film plane, and the magnetization direction of the first magnetic layer is changeable by a current flowing through the first magnetic layer, the first nonmagnetic layer, and the second magnetic layer.

The following is a description of basic concepts of magnetoresistive elements according to embodiments, with reference to the accompanying drawings.

In the following description, components having substantially identical functions and structures are denoted by identical reference numerals, and explanation of them is repeated only when necessary. It should be understood that the drawings are only schematic, and that the relationship between thicknesses and planar sizes, and the proportions of the thicknesses of respective layers differ from those in reality. Therefore, specific thicknesses and sizes should be determined by considering the following description.

Further, it is needless to say that there are differences in size relationship and proportion among the drawings.

The embodiments described below are merely examples of devices and methods for embodying the technical idea of the invention, and the technical idea does not limit the materials, shapes, structures, and arrangement of the components to those described below. Various changes may be made to the technical idea of the invention, without departing from the scope of the claimed invention.

First Embodiment

First, the structure of a magnetoresistive element according to a first embodiment is described.

Structure of the Magnetoresistive Element

FIG. 1 shows the magnetoresistive element 1 according to this embodiment. In FIG. 1, the arrows indicate the magnetization directions. In this specification, a magnetoresistive element is a TMR (tunneling magnetoresistive) device that has a semiconductor or an insulator used as a spacer layer. The accompanying drawings show the relevant parts of the magnetoresistive element 1. However, the magnetoresistive element 1 may include more layers, as long as the magnetoresistive element 1 includes the components shown in the drawings.

The magnetoresistive element 1 of this embodiment has a stacked structure in which a base layer 12, a magnetic layer 13, a nonmagnetic layer 15, a magnetic layer 17, and a cap layer 20 are stacked in this order. The magnetic layer 13 has an easy axis of magnetization in a direction perpendicular to the film plane (or in a direction perpendicular to the upper face), and the magnetization rotates (or precesses) about the easy axis of magnetization. Hereinafter, the magnetic layer 13 will be referred to as the storage layer 13. The specific characteristics of the storage layer 13 will be described later. Hereinafter, the magnetization in a direction perpendicular to the film plane will be referred to as the perpendicular magnetization.

The magnetic layer 17 has an easy axis of magnetization in a direction perpendicular to the film plane, and has a fixed magnetization direction, as opposed to the storage layer 13. A "fixed magnetization direction" indicates that the magnetization direction does not change before and after a write current is applied. Alternatively, the magnetic layer 17 is made of a magnetic material having a larger coercive force than that of the storage layer 13. Hereinafter, the magnetic layer 17 will be referred to as the fixed layer 17. The specific characteristics of the fixed layer 17 will be described later. In the typical example shown in FIG. 1, the magnetization of the fixed layer 17 is in the opposite direction from the substrate placed on the opposite side of the base layer 12 from the storage layer 13 (or in an upward direction), but may be in a direction toward the substrate (or in a downward direction).

The nonmagnetic layer (also referred to as the tunnel barrier layer) 15 is made of an oxide insulator or the like. The specific characteristics of the nonmagnetic layer 15 will be described later.

The magnetoresistive element 1 performs writing by a spin-injection magnetization switching method. That is, the relative angle between the magnetization directions of the storage layer 13 and the fixed layer 17 is switched between a parallel state and an antiparallel state (or the minimum resistance and the maximum resistance) in accordance with the direction of a spin-polarized current that is applied to each layer and flow in a direction perpendicular to the film plane, and the relative angle is associated with binary information "0" or "1". In this manner, the magnetoresistive element 1 stores information. More specifically, at the time of writing, a current that flows in a direction perpendicular to the film plane is applied from the fixed layer 17 to the storage layer 13, or from the storage layer 13 to the fixed layer 17, so that electrons holding spin information are injected from the fixed layer 17 into the storage layer 13. The spin angular momentum of the injected electrons is transferred to the electrons in the storage layer 13 under the principle of conservation of spin angular momentum, so that the magnetization of the storage layer 13 is reversed.

The magnetoresistive element 1 of this embodiment has a so-called top-pin structure in which the storage layer 13 and the upper layers are formed on the base layer 12, and the fixed layer 17 is formed on the nonmagnetic layer 15.

The base layer 12 is used to control the crystalline characteristics such as the crystalline orientations and the grain sizes of the layers located above the storage layer 13. The specific characteristics of the base layer 12 will be described later. The cap layer 20 functions mainly as a protection layer to prevent oxidation of the magnetic layer 17.

In the magnetoresistive element 1 of this embodiment shown in FIG. 1, the later described interfacial layers are not inserted. The magnetic materials forming the storage layer 13 and the fixed layer 17 may be materials each having a spin polarizability that is sufficient to realize a high TMR and a high spin-injection efficiency.

The magnetoresistive element 1 of this embodiment can be any of the magnetoresistive elements of the following modifications.

(First Modification)

Figure 2:
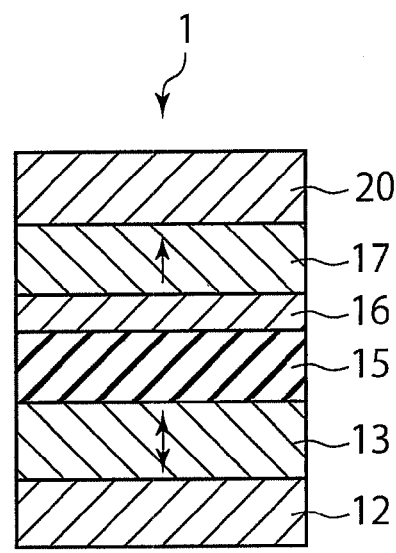
FIG. 2 is a cross-sectional view of the MR element according to a first modification of the first embodiment.

FIG. 2 shows a magnetoresistive element 1 according to a first modification of the first embodiment. The magnetoresistive element 1 of this modification differs from the magnetoresistive element 1 of the first embodiment shown in FIG. 1, in that an interfacial layer 16 is provided between the nonmagnetic layer 15 and the fixed layer 17. The interfacial layer 16 is made of a ferromagnetic material, and has the effect to reduce the lattice mismatch in the interface between the nonmagnetic layer 15 and the fixed layer 17. The interfacial layer 16 also has the effect to realize a high TMR and a high spin-injection efficiency by using a high-polarizability material.

(Second Modification)

Figure 3:
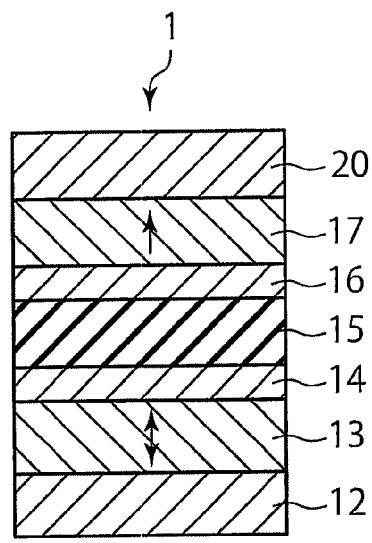
FIG. 3 is a cross-sectional view of the MR element according to a second modification of the first embodiment.

FIG. 3 shows a magnetoresistive element 1 according to a second modification of the first embodiment. The magnetoresistive element 1 of this modification differs from the magnetoresistive element 1 of the first embodiment shown in FIG. 1, in that an interfacial layer 14 is inserted between the storage layer 13 and the nonmagnetic layer 15, and an interfacial layer 16 is inserted between the nonmagnetic layer 15 and the fixed layer 17. Like the interfacial layer 16, the interfacial layer 14 is made of a ferromagnetic material. The interfacial layer 14 has the effect to reduce the lattice mismatch in the interface between the storage layer 13 and the nonmagnetic layer 15, and also has the effect to achieve a high TMR and a high spin-injection efficiency by using a high-polarizability material. The specific characteristics of the interfacial layer 14 and the interfacial layer 16 will be described later.

(Third Modification)

Figure 4:
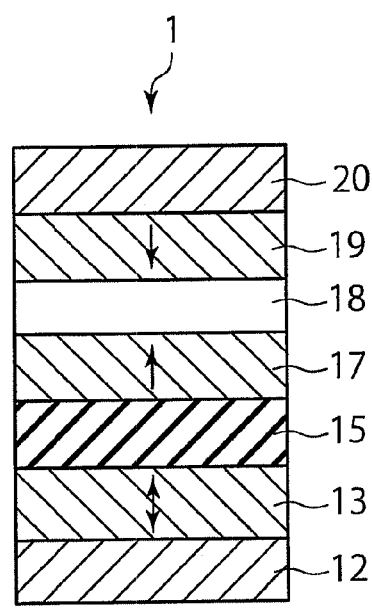
FIG. 4 is a cross-sectional view of the MR element according to a third modification of the first embodiment.

FIG. 4 shows a magnetoresistive element 1 according to a third modification of the first embodiment. The magnetoresistive element 1 of this modification differs from the magnetoresistive element 1 of the first embodiment shown in FIG. 1, in that a nonmagnetic layer 18 and a bias layer (hereinafter also referred to as a shift adjustment layer) 19 are formed in this order between the fixed layer and the cap layer 20. The bias layer 19 is a perpendicularly-magnetized film that is made of a ferromagnetic material and has an easy axis of magnetization in a direction perpendicular to the film plane. The magnetization of the bias layer 19 is fixed in the opposite direction from the magnetization direction of the fixed layer 17. The bias layer 19 has the effect to adjust the offset of the magnetization switching characteristics in the storage layer 13 toward opposite direction. The offset appears due to a leakage magnetic field from the fixed layer 17, and becomes a problem during the device processing. In the third modification, the interfacial layer 14 or the interfacial layer 17 may be inserted between the storage layer 13 and the nonmagnetic layer 15 or between the nonmagnetic layer 15 and the fixed layer 17. The specific characteristics of the nonmagnetic layer 18 and the bias layer 19 will be described later in detail.

In the following, the respective layers constituting the magnetoresistive elements of the first embodiment and its modifications are described in detail, starting from the storage layer 13.

Storage Layer 13

When a perpendicular magnetization film is used as the storage layer 13, shape anisotropies are not used as described above. Accordingly, the device shape can be made smaller than that of a magnetoresistive element of an in-plane magnetization type. Further, by using a material having a high magnetic crystalline anisotropy, both miniaturization and a lower current can be realized at the same time while a resistance to thermal disturbance is maintained. In the following, the characteristics required in the storage layer, and specific examples of materials that can be selected are described in detail.

Characteristics Required in Storage Layer 13

When a perpendicular magnetization material is used as the storage layer 13, the thermal disturbance index $\Delta$ is expressed as follows by calculating the ratio between the effective anisotropy energy ($K_u^{eff} \cdot V$) and the thermal energy ($k_B T$):

$$\Delta = K_u^{eff} \cdot V / (k_B T) \quad (1)$$
$$= (K_u - 2\pi N M_s^2) \cdot Va / (k_B T)$$

Here, $K_u$ represents the magnetic crystalline anisotropy constant, $M_s$ represents the saturation magnetization, N represents the demagnetizing coefficient, Va represents activation volume, $k_B$ represents the Boltzmann constant, and T represents the absolute temperature (K).

To avoid the problem of magnetization fluctuations (thermal disturbance) caused by a thermal energy, the thermal disturbance index $\Delta$ needs to be 60 or higher. However, if the device size and the film thicknesses are made smaller to achieve a larger capacity, the activation volume Va becomes smaller, and the stored information cannot be maintained by the thermal disturbance. Therefore, for the storage layer 13, it is preferable to select a material having a high magnetic crystalline anisotropy constant $K_u$ and/or a small saturation magnetization $M_s$. Meanwhile, it is known that the critical current $I_c$ required for a magnetization switching through spin-injection writing is normally expressed as:

$$I_c \propto \alpha \cdot \eta \cdot \Delta \qquad (2)$$

Here, $\alpha$ represents the magnetic damping constant, and $\eta$ represents the spin-injection efficiency coefficient. The activation volume Va becomes larger as the saturation magnetization $M_s$ becomes smaller. Therefore, to lower the switching current while maintaining the minimum thermal stability factor $\Delta$, it is preferable to select a material having a small saturation magnetization $M_s$.

Material for Storage Layer 13

To realize a perpendicular magnetization film that can achieve both a high resistance to thermal disturbance and magnetization switchings with a low current, the material of the storage layer 13 preferably has a small saturation magnetization $M_s$, a magnetic anisotropy $K_u$ that is high enough to maintain the thermal stability factor ($\Delta$), and a high spin polarization. Examples of materials satisfying such requirements include MnGa alloys having compositions exhibiting ferrimagnetism. In the following, this aspect is described in greater detail.

(First Specific Example ($DO_{22}$-$Mn_{3-\delta}$Ga) of Storage Layer Material)

Figure 5:
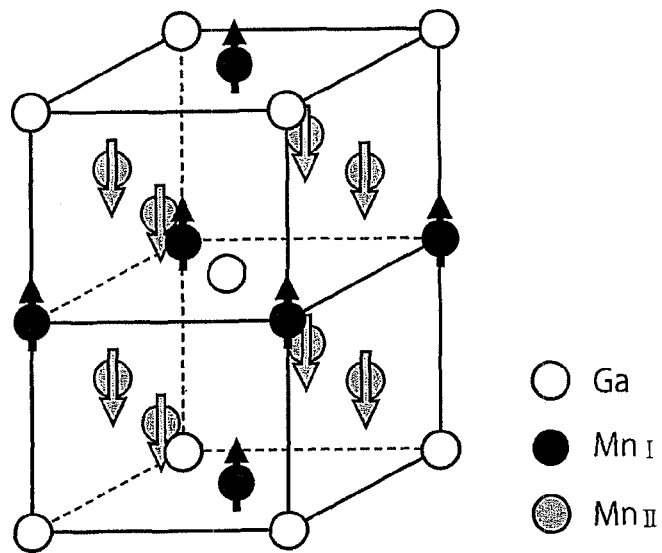
FIG. 5 is a diagram for explaining a $DO_{22}$ structure.

A first specific example of the storage layer 13 is made of an alloy of manganese (Mn) and gallium (Ga) having a $DO_{22}$ phase. A $Mn_{3-\delta}$Ga alloy has a $DO_{22}$ structure as shown in FIG. 5. The $DO_{22}$ structure is based on a face-centered tetragonal (FCT) structure having a Mn composition in range of $0.15 < \delta < 1.05$ (66 to 74 atomic %). The $Mn_{3-\delta}$Ga alloy has ferrimagnetism while the above composition range is maintained. To form a perpendicular magnetization film, the c-axis should be grown in a direction perpendicular to the film plane, or should be grown in a (002) orientation. Specifically, the crystalline orientation growth of the storage layer 13 can be controlled by appropriately selecting the base layer 12 shown in FIGS. 1 through 4. The details about the base layer 12 and a specific method of manufacturing the base layer 12 will be described later.

Figure 6:
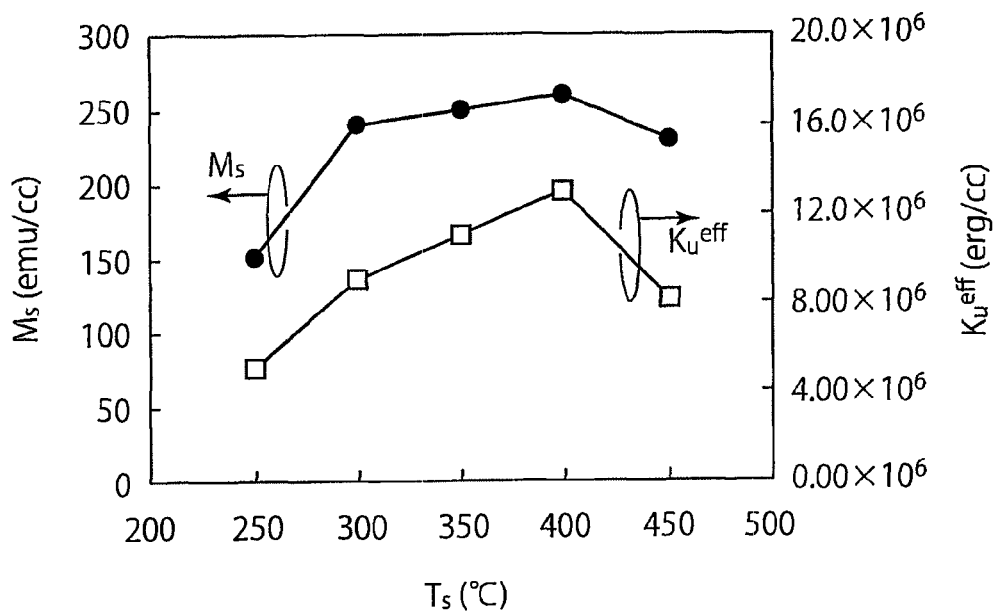
FIG. 6 is a diagram showing the heating film-formation temperature dependence of the saturation magnetization and the effective perpendicular magnetic anisotropy energy of a MnGa film having a $DO_{22}$ structure.

FIG. 6 shows the substrate heating film-formation temperature dependence of the saturation magnetization $M_s$ and effective perpendicular magnetic anisotropy constant $K_u^{eff}$ of $Mn_{2.5}$Ga that is formed on the base layer 12 and has a $DO_{22}$ structure, for example. More highly-oriented $Mn_{2.5}$Ga that is (002) crystalline-oriented can be manufactured by forming a film with heat on the orientation-controlled base layer 12. As a result of a specific experiment, it was confirmed that the highest perpendicular magnetic anisotropy appears in the neighborhood of 400° C. in substrate temperature $T_s$ (see FIG. 6).

Figure 7:
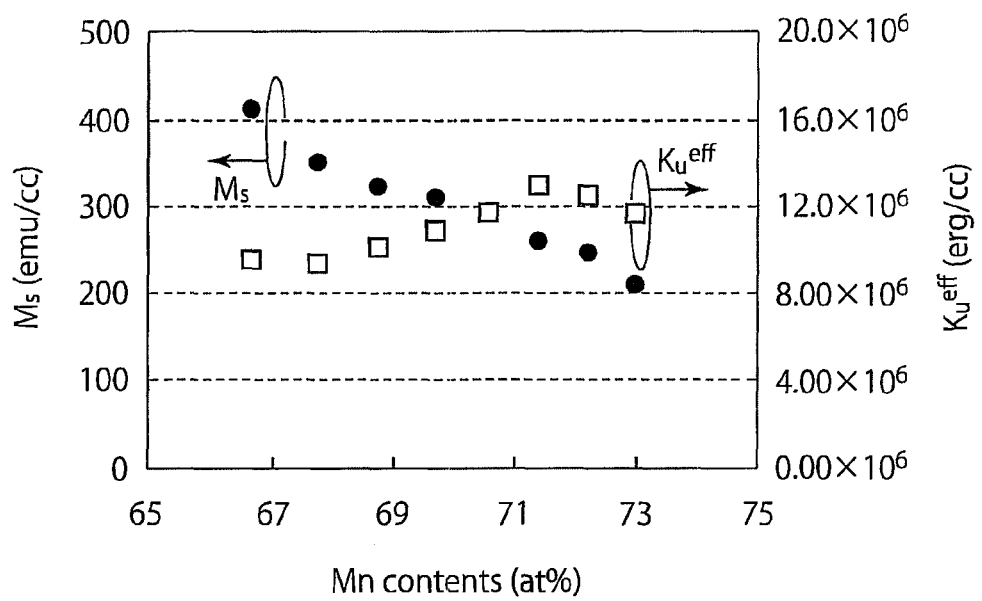
FIG. 7 is a diagram showing the Mn concentration dependence of the saturation magnetization and the effective perpendicular magnetic anisotropy energy of the MnGa film having the $DO_{22}$ structure.

FIG. 7 shows the Mn composition dependence of the saturation magnetization $M_s$ and effective magnetic anisotropy constant $K_u^{eff}$ of perpendicular magnetization $Mn_{3-\delta}$Ga manufactured as above. It became apparent that a high effective perpendicular magnetic anisotropy of $1 \times 10^7$ (erg/cc) or higher can be obtained with a low saturation magnetization (<300 (emu/cc)) by controlling the Mn component. Further, according to references such as J. Winterlink, et al., Phys. Rev. B, 77 (2008) 054406 and J. Kubler, et al., J. Phys: Condens. MatterB, 18 (2006) 9795, the spin polarization of $Mn_{3-\delta}$Ga having the above composition range is predicted to be as high as approximately 66 to 98% in terms of a band calculation. Further, compared with half-metallic materials and Heusler materials that have been actively studied as high-polarizability materials, $Mn_{3-\delta}$Ga has a high Currie temperature of approximately 700 K or higher, and can have a stable $DO_{22}$ structure. Accordingly, $Mn_{3-\delta}$Ga is preferable as a material that has the characteristics required for the storage layer 13.

(Second Specific Example ($L1_0$-MnGa) of Storage Layer Material)

Figure 8:
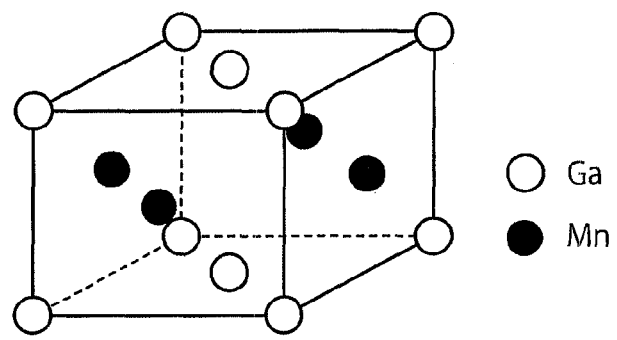
FIG. 8 is a diagram for explaining an $L1_0$ structure.

A second specific example of the storage layer 13 is made of an alloy of manganese (Mn) and gallium (Ga) having an $L1_0$ phase. A MnGa alloy becomes a ferromagnetic material when the Mn composition ratio is 50 atomic %. To achieve a lower saturation magnetization $M_s$, Mn should be added. Specifically, if the Mn composition ratio becomes higher than that, displacement by Mn occurs at the Ga sites, and the Mn at the Ga sites have spin arrangement antiparallel to the Mn at the Mn sites. As a result, where the Mn composition ratio is in the range of 64 to 66 atomic %, the alloy becomes a ferrimagnetic material having an $L1_0$-(CuAu-)ordered structure phase as a stable phase as shown in FIG. 8. Such an $L1_0$-ordered structure phase is called a $\tau$ phase or $\epsilon'$ phase in a phase diagram, and has a face-centered tetragonal (FCT) structure as the basic lattice. In this manner, the effective saturation magnetization $M_s$ can be adjusted to 50 (emu/cc) or smaller. To form a perpendicular magnetization film, the c-axis should be grown in a direction perpendicular to the film plane, or should be grown in a (001) orientation. Specifically, the crystalline orientation growth of the storage layer 13 can be controlled by appropriately selecting the base layer 12 shown in FIGS. 1 through 4. The details about the base layer 12 and a specific method of manufacturing the base layer 12 will be described later. In the above composition range, the MnGa alloy has a high effective perpendicular magnetic anisotropy of $5 \times 10^6$ (erg/cc), and has a high Currie temperature of approximately 690 K. Accordingly, the MnGa alloy has the characteristics required in the storage layer 13.

Base Layer 12

In the $DO_{22}$ structure and the $L1_0$ structure described in the above detailed description of the storage layer 13, the lattice constant c in the [001] orientation is normally not equal to the lattice constant a in the [100] orientation and the lattice constant a in the [010] orientation. Accordingly, a ferromagnetic alloy having a $DO_{22}$ structure or an $L1_0$ structure has the c-axis as the easy axis of magnetization. That is, to form a perpendicular magnetization film having an easy axis of magnetization in a direction perpendicular to the film plane, it is necessary to control the crystalline orientations of a $DO_{22}$ structure and a $L1_0$ structure to be oriented to the (002) plane and the (001) plane. Therefore, it is critical to select an appropriate material and an appropriate stacked structure for the base layer 12. The material and the stacked structure of the base layer 12 are described below in detail. However, the lattice constant a in the [100] orientation of a $DO_{22}$ structure and the lattice constant a in the [100] orientation of an $L1_0$ structure are close to each other at approximately 3.90 angstroms. Therefore, the specific examples of materials and stacked structures described below may be applied to both cases where the storage layer 13 is made of MnGa having a $DO_{22}$ structure and where the storage layer 13 is made of MnGa having an $L1_0$ structure.

(Stacked Structure of Base Layer 12)

Figure 9:
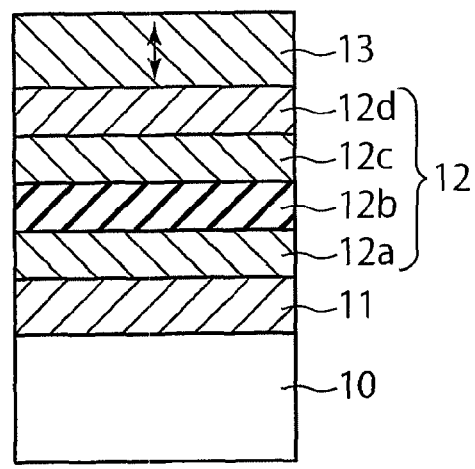
FIG. 9 is a cross-sectional view of a stacked structure including a base layer and a storage layer.

FIG. 9 is a cross-sectional view of a stacked structure including the base layer 12 and the storage layer 13. In the stacked structure illustrated in FIG. 9, a Ta layer having a film thickness of approximately 5 nm as a contact layer 11 to be in contact with the base layer 12, the base layer 12, and a MnGa layer having a film thickness of approximately 2 nm as the storage layer 13 having a $DO_{22}$ structure or an $L1_0$ structure on the base layer 12 are sequentially formed on a Si substrate 10 having a thermally-oxidized film. The structure formed on the MnGa layer is the same as the structure of the first embodiment or one of the modifications illustrated in FIGS. 1 through 4.

The base layer 12 is preferably a structure that is formed by sequentially stacking a base layer 12a that is an amorphous layer having a film thickness of approximately 3 nm, a base layer 12b that is an oxide layer having a film thickness of approximately 0.5 nm, a base layer 12c that is a nitride layer having a NaCl structure or a conductive oxide layer having a perovskite structure of approximately 20 nm in film thickness, and a base layer 12d that is a metal layer having a film thickness of approximately 3 nm. Among those base layers 12a through 12d, it is necessary to include the base layer 12c made of a nitride having a NaCl structure or a conductive oxide having a perovskite structure. This is because, as the base layer 12 includes a nitride layer 12c having a NaCl structure or a conductive oxide layer 12c having a perovskite structure, the storage layer 13 can be made of a ferrimagnetic MnGa alloy having excellent (002)-plane crystalline orientation in the case of a $DO_{22}$ structure and excellent (001)-plane crystalline orientation in the case of an $L1_0$ structure, as well as excellent smoothness.

Further, to control the crystalline orientation and smoothness of the nitride layer 12c, the base layer 12 preferably includes an amorphous layer such as $Co_{40}Fe_{40}B_{20}$ or a microcrystalline layer as the base layer 12a, an oxide layer having a NaCl structure as the base layer 12b, and a metal layer having a tetragonal structure or a cubic structure as the base layer 12d. The specific materials for the base layers 12a through 12d included in the base layer 12 will be described later.

(Materials for Base Layer 12)

In the base layer 12, a nitride having a NaCl structure or a conductive oxide having a perovskite structure is used as the base layer 12c. That is, as the nitride having a NaCl structure, a nitride that has a NaCl structure oriented to the (001) plane and is of at least one element selected from Ti, Zr, Nb, V, Hf, Ta, Mo, W, B, Al, and Ce is used. Examples of nitrides having a NaCl structure includes TiN, ZrN, NbN, and VN. Alternatively, a nitride of two metallic elements, such as Ti—Zr—N or Ti—Al—N, can be used, instead of a nitride of one metallic element such as TiN. Further, other than nitrides Ti, Zr, Nb, and V, a nitride of Hf, Ta, Mo, W, B, Al, Ce, or the like can be used. However, with the stability of a nitride being taken into consideration, a nitride having a low standard free energy of formation is preferred. The typical nitrides having a NaCl structure are ZrN, TiN, CeN, VN, and CrN in the ascending order of the standard free energy of formation at 500° C. (see Metal Data Book, p. 90, compiled by the Japan Institute of Metals, for example). If a nitride cannot exist in a stable manner, part of the element forming the nitride might diffuse in the heating processes at the time of nitride formation and after the nitride formation. Therefore, the nitride used in this embodiment preferably has a low standard energy of formation, and, in view of that, ZrN, TiN, and CeN are more preferable. Meanwhile, the lattice constants of those nitrides, ZrN, TiN, and CeN, are 4.54 angstroms, 4.22 angstroms, and 5.02 angstroms, respectively. The lattice constant a in the [100] orientation of MnGa having a $DO_{22}$ structure and the lattice constant a in the [100] orientation of MnGa having an $L1_0$ structure are approximately 3.90 angstroms, as described above. Therefore, in view of the lattice constant, TiN, ZrN, and CeN are preferable in this order. If the film thickness is too large, the smoothness becomes poorer, and, if the film thickness is too small, the film does not function as a nitride. Therefore, the film thickness is preferably in the range of 3 to 30 nm.

Other than nitrides having a NaCl structure, a conductive oxide having a perovskite structure oriented to the (002) plane can be used as the material having the same advantages as above in the base layer 12. Specifically, where a perovskite oxide is expressed as $ABO_3$, the site A is formed with at least one element selected from strontium (Sr), cerium (Ce), dysprosium (Dy), lanthanum (La), K (potassium), Ca (calcium), sodium (Na), lead (Pb), barium (Ba), or the like. The site B is formed with at least one element selected from titanium (Ti), vanadium (V), chromium (Cr), manganese (Mn), iron (Fe), cobalt (Co), nickel (Ni), gallium (Ga), niobium (Nb), molybdenum (Mo), ruthenium (Ru), iridium (Ir), Ta (tantalum), cerium (Ce), lead (Pd), or the like. That is, examples of perovskite oxides include $SrRuO_3$, $Sr(Ti, Ru)O_3$, $SrNbO_3$, $Sr(Ti, V)O_3$, $SrCrO_3$, $SrFeO_3$, $SrCoO_3$, $SrNbO_3$, $SrMoO_3$, $SrIrO_3$, $CeGaO_3$, $DyMnO_3$, $LaTiO_3$, $LaVO_3$, $La_{1-x}Sr_xMnO_3$, $La_{1-x}Sr_xCoO_3$, $LaNiO_3$, $KTaO_3$, $PbTiO_3$, $BaMoO_3$, $CaCeO_3$, $CaCrO_3$, and $CaRuO_3$. The lattice constants a of the (001) planes of those oxides are approximately 3.7 to 4.0 angstroms, and those oxides excel in crystalline orientation. Accordingly, any of those oxides is preferable as a base layer. A material having a high heat resistance, low lattice mismatch, and a low resistance should be appropriately selected from the above mentioned materials. Further, the electrical conductivity of a perovskite oxide can be adjusted by causing an oxygen deficit.

In the base layer 12, an amorphous layer or a microcrystalline layer is used as the base layer 12a, to improve the smoothness and the crystalline orientations of the oxide having a NaCl structure functioning as the base layer 12b and the nitride having a NaCl structure or the conductive oxide having a perovskite structure functioning as the base layer 12c. The base layer 12a having an amorphous structure (or a microcrystalline structure) can be made of a metal containing at least one element selected from iron (Fe), cobalt (Co), and nickel (Ni), and at least one element selected from boron (B), niobium (Nb), silicon (Si), tantalum (Ta), and zirconium (Zr). Specifically, the amorphous layer (or the microcrystalline layer) can be a $Co_{40}Fe_{40}B_{20}$ layer, a $Co_{80}B_{20}$ layer, a $Fe_{80}Si_{10}B_{10}$ layer, or the like. Further, CoZrB, NiSiB, FeNiSiB, FeCoZrB, and the like are also preferable materials. Those amorphous layers (or microcrystalline layers) do not show clear crystalline structures at the time of formation, but some part of an amorphous layer (or a microcrystalline layer) can exhibit a clear crystalline structure when crystallization partially starts through the heating process after the film formation. That is, if the device is functioning in the end, the amorphous layer (or the microcrystalline structure) may exhibit a crystalline structure. If an amorphous layer is used as the base layer 12a, the oxide having a NaCl structure functioning as the base layer 12b, and the nitride having a NaCl structure or the conductive oxide having a perovskite structure functioning as the base layer 12c are easily grown in the (100) plane in a high-orientation manner. If the amorphous layer as the base layer 12a is too thick, the film formation takes a long time, resulting in a lower productivity. If the amorphous layer as the base layer 12a is too thin, the above described orientation control effect is lost. Therefore, the film thickness is preferably in the range of 1 to 10 nm.

In the base layer 12, an oxide having a NaCl structure is used so as to improve the smoothness and crystalline orientation of each of the base layers 12c and 12d. The oxide having a NaCl structure may be a material having main components that includes at least one element selected from magnesium (Mg), calcium (Ca), vanadium (V), niobium (Nb), manganese (Mn), iron (Fe), cobalt (Co), and nickel (Ni). If the oxide forming the base layer 12b is too thick, the resistance becomes higher, and a series resistance is added. As a result, the ratio of the magnetoresistance generated in the nonmagnetic layer (the tunnel barrier layer) 15 becomes lower. Therefore, the resistance of the base layer 12b needs to be at least lower than the resistance of the nonmagnetic layer 15, and the film thickness thereof is preferably smaller than 1 nm.

In the base layer 12, as the base layer 12d, it is preferable to use a metal that has a tetragonal structure or a cubic structure, has a lattice constant in the range of 2.7 to 3.0 angstroms or in the range of 3.7 to 4.2 angstroms, and is oriented to the (001) plane. The c-axis orientation of the MnGa storage layer 13 having a $DO_{22}$ structure or an $L1_0$ structure can be made more improved by forming the base layer 12d as a buffer layer between the base layer 12c and the storage layer 13, than that by forming MnGa having a $DO_{22}$ structure or an $L1_0$ structure as the storage layer 13 directly on the nitride or the oxide serving as the base layer 12c. The specific material of the base layer 12d is preferably at least one element selected from rhodium (Rh), iridium (Ir), palladium (Pd), platinum (Pt), copper (Cu), silver (Ag), and gold (Au), or an alloy having at least one of those elements as a main component. If the metal layer serving as the base layer 12d is too thick, the smoothness thereof becomes poorer, and, if the metal layer is too thin, the base layer 12d does not sufficiently function as a layer that adjusts the orientation of the ordered alloy having a $DO_{22}$ structure or an $L1_0$ structure. Therefore, the thickness of the metal layer serving as the base layer 12d is preferably in the range of 1 to 10 nm.

Nonmagnetic Layer 15

The material of the nonmagnetic layer 15 is preferably an oxide having a NaCl structure. Specific examples of such oxides include MgO, CaO, SrO, TiO, VO, and NbO. The (100) plane is easily grown as the preferential orientation plane, if the oxide having a NaCl structure is grown in one of the following situations: where crystals are grown on an alloy containing one of Fe, Co, and Ni or two or more of Fe, Co, and Ni as the main components, such as an amorphous CoFeNiB alloy; where crystals are grown on an alloy that has a body-centered cubic (BCC) structure, has an (100) preferential orientation plane, and contains one of Fe, Co, and Ni or two or more of Fe, Co, and Ni as the main components; where crystals are grown on the (002) plane of an alloy having a $DO_{22}$ structure; and where crystals are grown on the (001)-oriented plane of an $L1_0$-ordered alloy having a FCT structure. Particularly, the (100) plane can be formed as the preferential orientation plane with greater ease on a CoFe—X amorphous alloy to which B, C, N, or the like is added.

When the magnetization direction of the storage layer 13 and the magnetization direction of the fixed layer 17 are antiparallel to each other, the spin-polarized $\Delta_1$ band functions to carry out tunnel conduction, and therefore, only the majority spin electrons contribute to conduction. As a result, the conductivity of the magnetoresistive element 1 becomes lower, and the resistance value becomes larger. When the magnetization direction of the storage layer 13 and the magnetization direction of the fixed layer 17 are parallel to each other, the $\Delta_5$ band that is not spin-polarized dominates conduction. As a result, the conductivity of the magnetoresistive element 1 becomes higher, and the resistance value becomes smaller. Therefore, the formation of the $\Delta_1$ band is critical in achieving a high MR ratio. To form the $\Delta_1$ band, there should be a high lattice coherency in the interfaces of the (100) plane of the nonmagnetic layer 15 made of an oxide having a NaCl structure with the storage layer 13 and the fixed layer 17.

To further improve the lattice match in the (100) plane of the nonmagnetic layer 15 made of an oxide layer having a NaCl structure, the interfacial layer 14 may be inserted between the nonmagnetic layer 15 and the storage layer 13, and the interfacial layer 16 may be inserted between the nonmagnetic layer 15 and the fixed layer 17. To form the $\Delta_1$ band, it is more preferable to select a material of 5% or lower in lattice mismatch in the (100) plane of the nonmagnetic layer 15, and use the material as the interfacial layer 14 and the interfacial layer 16.

Fixed Layer 17

A material having a magnetization direction that is not easily changed with respect to the storage layer 13 is preferably selected as the fixed layer 17. That is, it is preferable to select a material having a high effective magnetic anisotropy $K_u^{eff}$ and a large saturation magnetization $M_s$, and having a large magnetic relaxation constant $\alpha$. The specific material of the fixed layer 17 will be described later.

(Ordered Alloys)

An ordered alloy that can be used is an alloy containing at least one element selected from Fe, Co, and Ni, and at least one element selected from Pt and Pd, and the crystalline structure of the alloy is of the $L1_0$ type. Examples of such ordered alloys include $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$. Those ordered alloys do not necessarily have the above composition ratios. The effective magnetic anisotropy energy and the saturation magnetization can be adjusted by adding an impurity element such as Cu (copper), Cr (chromium), or Ag (silver), or an alloy of one of those elements, or an insulating material to those ordered alloys. When one of those alloys is used as the fixed layer 17, or particularly when a material having a large lattice mismatch with the nonmagnetic layer 15 is selected, it is preferable to insert the interfacial layer 16 between the nonmagnetic layer 15 and the fixed layer 17, as in the first modification illustrated in FIG. 2.

(Artificial Lattices)

An artificial lattice is a structure formed by alternately stacking an alloy containing at least one element selected from Fe, Co, and Ni, and an alloy containing at least one element selected from Cr, Pt, Pd, Ir, Rh, Ru, Os, Re, Au, and Cu. Examples of such artificial lattices include a Co/Pt artificial lattice, a Co/Pt artificial lattice, a CoCr/Pt artificial lattice, a Co/Ru artificial lattice, Co/Os, Co/Au, and a Ni/Cu artificial lattice. The effective magnetic anisotropy energy and the saturation magnetization of each of those artificial lattices can be adjusted by adding an element to the magnetic layer, and adjusting the film thickness ratio and the stacking cycles between the magnetic layer and the nonmagnetic layer. In most cases where one of those stack films is used as the fixed layer 17, the lattice mismatch with the nonmagnetic layer 15 is large, which is not preferable when a high MR ratio is to be achieved. In such cases, it is preferable to insert the interfacial layer 16 between the nonmagnetic layer 15 and the fixed layer 17, as in the first modification illustrated in FIG. 2.

(Disordered Alloys)

A disordered alloy is a metal that contains cobalt (Co) as the main component, and also contains at least one element selected from chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni). Examples of such disordered alloys include a CoCr alloy, a CoPt alloy, a CoCrTa alloy, a CoCrPt alloy, a CoCrPtTa alloy, and a CoCrNb alloy. The effective magnetic anisotropy energy and the saturation magnetization of each of those alloys can be adjusted by increasing the proportion of the nonmagnetic element. In most cases where one of those alloys is used as the fixed layer 17, the lattice mismatch with the nonmagnetic layer 15 is large, which is not preferable when a high MR ratio is to be achieved. In such cases, it is preferable to insert the interfacial 16 between the nonmagnetic layer 15 and the fixed layer 17, as in the first modification illustrated in FIG. 2.

Interfacial Layers

The interfacial layer 16 and the interfacial layer 14 shown in FIGS. 2 and 3 are inserted into the interfaces between the nonmagnetic layer 15 and the fixed layer 17 and between the nonmagnetic layer 15 and the storage layer 13, so as to increase the magnetoresistance ratio (the TMR ratio). Each of the interfacial layer 14 and the interfacial layer 16 is preferably made of a high-polarizability material or, more specifically, an alloy $(Co_{100-x}Fe_x)_{100-y}B_y$ ($x \geq 20$ atomic %, $0 < y \leq 30$ atomic %). Further, each of the interfacial layer 16 and the interfacial layer 14 preferably has a cubic structure or a tetragonal structure, and is preferably oriented to the (100) plane. By using such magnetic materials as the interfacial layer 16 and the interfacial layer 14, the lattice mismatch between the fixed layer 17 and the nonmagnetic layer 15, and the lattice mismatch between the storage layer 13 and the nonmagnetic layer 15 are reduced. Further, since such magnetic materials are high-polarizability materials, the effect to realize a high MR ratio and a high spin-injection efficiency can be expected.

Bias Layer

As in the third modification illustrated in FIG. 4, the nonmagnetic layer 18 and the bias layer 19 may be provided between the fixed layer 17 and the cap layer 20. With this arrangement, the shift of the switching current in the storage layer 13 due to a leak magnetic field generated from the fixed layer 17 can be reduced and adjusted.

The nonmagnetic layer 18 preferably has such a heat resistance that the fixed layer 17 and the bias layer 19 do not mix with each other in the heating process, and has the function to control the crystalline orientation when the bias layer 19 is formed. Further, as the film thickness of the nonmagnetic layer 18 becomes greater, the distance between the bias layer 19 and the storage layer 13 becomes longer, and the shift adjustment field to be applied from the bias layer 19 to the storage layer 13 becomes smaller. Therefore, the film thickness of the nonmagnetic layer 18 is preferably 5 nm or smaller. The bias layer 19 is made of a ferromagnetic material having an easy axis of magnetization in a direction perpendicular to the film plane. Specifically, the materials mentioned as those which can be used for the fixed layer 17 can be used. However, since the bias layer 19 is further away from the storage layer 13 than the fixed layer 17 is, the film thickness or saturation magnetization $M_s$ of the bias layer 19 needs to be greater than that of the fixed layer 17 so that the leak magnetic field applied to the storage layer 13 can be adjusted by the bias layer 19. According to the results of studies made by the inventors, where $t_2$ and $M_{s2}$ represent the film thickness and saturation magnetization of the fixed layer 17, and $t_{22}$ and $M_{s22}$ represent the film thickness and saturation magnetization of the bias layer 19, the following relationship needs to be satisfied:

$$M_{s2} \times t_2 < M_{s22} \times t_{22} \quad (3)$$

When the device size is 50 nm in a hypothetical manufacturing process, for example, a magnetic material having a saturation magnetization $M_{s2}$ of 1000 emu/cc and a film thickness $t_2$ of 5 nm is used as the fixed layer 17, so as to cancel the shift of the switching current. In that case, the following bias layer characteristics are required: the film thickness of the nonmagnetic layer 18 is 3 nm, the saturation magnetization $M_{s22}$ of the bias layer 19 is 1000 emu/cc, and the film thickness $t_{22}$ of the bias layer 19 is approximately 15 nm.

To achieve the above described shift canceling effect, the magnetization directions of the fixed layer 17 and the bias layer 19 need to be made antiparallel to each other. To satisfy such a relationship, a material that satisfies the relationship, $H_{c2} > H_{c22}$ or $H_{c2} < H_{c22}$, between the coercive force $H_{c2}$ of the fixed layer 17 and the coercive force $H_{c22}$ of the bias layer 19 should be selected. In that case, the magnetization direction of the layer with the smaller coercive force is reversed beforehand by minor loop magnetizing. In this manner, the magnetization directions of the fixed layer 17 and the bias layer 19 can be made antiparallel to each other. The magnetization directions of the fixed layer 17 and the bias layer 19 can also be made antiparallel to each other by antiferromagnetically coupling the fixed layer 17 and the bias layer 19 to each other via the nonmagnetic layer 18 (SAF (Synthetic Anti-Ferromagnetic) coupling). Specifically, ruthenium (Ru) is used as the material of the nonmagnetic layer 18, for example. With this arrangement, the fixed layer 17 and the bias layer 19 can be coupled to each other so that the magnetization directions of the fixed layer 17 and the bias layer 19 can be made antiparallel to each other. Accordingly, the leak magnetic field generated from the fixed layer 17 can be reduced by the bias layer 19, and the shift of the switching current of the storage layer 13 can be made smaller. As a result, the variation of the switching current of the storage layer 13 among devices can also be made smaller.

As described above, according to the first embodiment, each magnetoresistive element 1 is a magnetoresistive element of a spin-injection writing type that is thermally stable and can have a magnetization switching with a low current.

Second Embodiment

Figure 10:
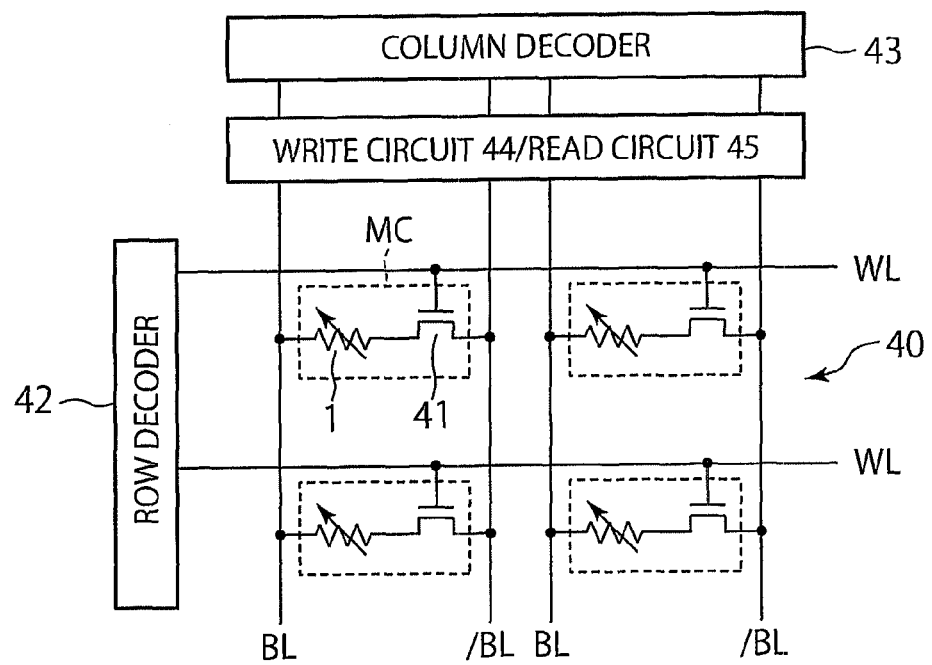
FIG. 10 is a circuit diagram showing the structure of an MRAM according to a second embodiment.

Next, an MRAM according to a second embodiment is described. The MRAM of this embodiment is an MRAM using the magnetoresistive element 1 of the first embodiment, and the structure thereof is shown in FIG. 10. The MRAM includes a memory cell array 40 having memory cells MC arranged in a matrix fashion. In the memory cell array 40, pairs of bit lines BL and /BL are arranged to extend in the column direction. Further, in the memory cell array 40, word lines WL are arranged to extend in the row direction.

The memory cells MC are placed at the intersections of the bit lines BL with the word lines WL. Each of the memory cells MC includes the magnetoresistive element 1 and a select transistor 41 that is an N-channel MOS transistor. One terminal of the magnetoresistive element 1 is connected to the corresponding bit line BL. The other terminal of the magnetoresistive element 1 is connected to the drain terminal of the select transistor 41. The gate terminal of the select transistor 41 is connected to the corresponding word line WL. The source terminal of the select transistor 41 is connected to the corresponding bit line /BL.

A row decoder 42 is connected to the word line WL. A write circuit 44 and a read circuit 45 are connected to the pairs of bit lines BL and /BL. A column decoder 43 is connected to the write circuit 44 and the read circuit 45. Each of the memory cells MC is to be selected by the row decoder 42 and the column decoder 43.

Data is written into a memory cell MC in the following manner. First, to select the memory cell MC into which data is to be written, the word line WL connected to the memory cell MC is activated. As a result of this, the select transistor 41 is turned on.

A bidirectional write current Iw is then supplied to the magnetoresistive element 1 in accordance with the data to be written. Specifically, when the write current Iw is supplied to the magnetoresistive element 1 from left to right, the write circuit 44 applies a positive voltage to the bit line BL, and applies a ground voltage to the bit line /BL. When the write current Iw is supplied to the magnetoresistive element 1 from right to left, the write circuit 44 applies a positive voltage to the bit line /BL, and applies a ground voltage to the bit line BL. In this manner, data "0" or data "1" can be written into the memory cell MC.

Data is read from a memory cell MC in the following manner. First, the select transistor 41 of the selected memory cell MC is turned on. The read circuit 45 supplies a read current Ir flowing from right to left, for example, to the magnetoresistive element 1. Based on the read current Ir, the read circuit 45 detects the resistance value of the magnetoresistive element 1. In this manner, the data stored in the magnetoresistive element 1 can be read out.

Figure 11:
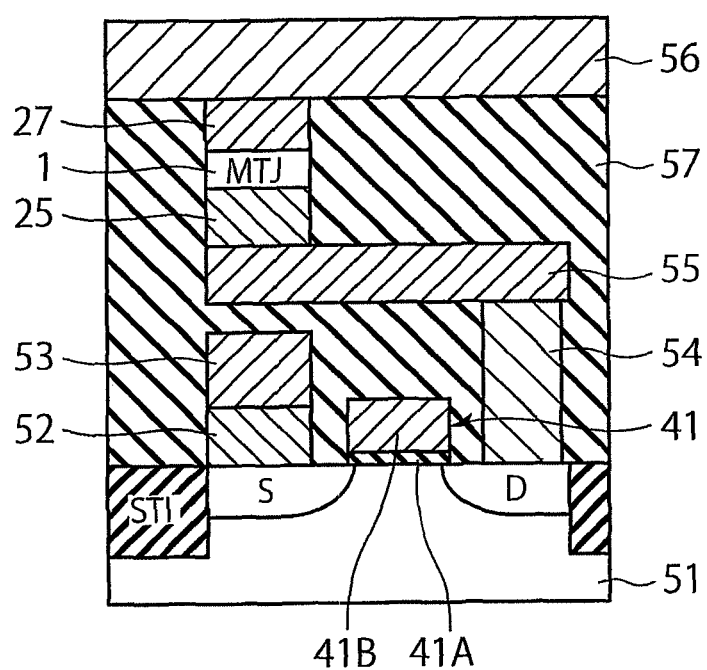
FIG. 11 is a cross-sectional view of the structure of the MRAM, mainly showing a memory cell MC.

Referring now to FIG. 11, the structure of the MRAM is described. FIG. 11 is a cross-sectional view of a memory cell MC. A device isolation insulating layer is formed in the surface region of a P-type semiconductor substrate 51, and the portion of the surface region of the semiconductor substrate 51 in which the device isolation insulating layer is not formed serves as the active area in which the device is to be formed. The device isolation insulating layer is formed by STI (Shallow Trench Isolation), for example. For the STI, silicon oxide is used, for example.

In the active area of the semiconductor substrate 51, a source region S and a drain region D are formed at a distance from each other. The source region S and the drain region D are $N^+$-type diffusion regions formed by introducing high-concentration $N^+$-type impurities into the semiconductor substrate 51. A gate electrode 41B is formed on a portion of the semiconductor substrate 51 via a gate insulating film 41A. The portion of the semiconductor substrate 51 is located between the source region S and the drain region D. The gate electrode 41B functions as the word line WL. In this manner, the select transistor 41 is formed on the semiconductor substrate 51.

A wire layer 53 is formed above the source region S via a contact 52. The wire layer 53 functions as the bit line /BL. A leading wire 55 is formed above the drain region D via a contact 54. Above the leading wire 55A, a lower electrode 25, the magnetoresistive element 1, and an upper electrode 27 is stacked in this order. A wire layer 56 is formed on the upper electrode 27. The wire layer 56 functions as the bit line BL. The space between the semiconductor substrate 51 and the wire layer 56 is filled with an interlayer insulating layer 57 made of silicon oxide, for example.

As described above in detail, according to the second embodiment, a MRAM can be formed with the use of the magnetoresistive elements 1 in the first embodiment. It should be noted that the magnetoresistive elements 1 can be used not only as spin-injection magnetic memories but also as magnetic memories of a domain-wall displacement type.

The MRAM according to the second embodiment can be used in various apparatuses. In the following, a few examples of applications of the MRAM are described.

Example Application 1

Figure 12:
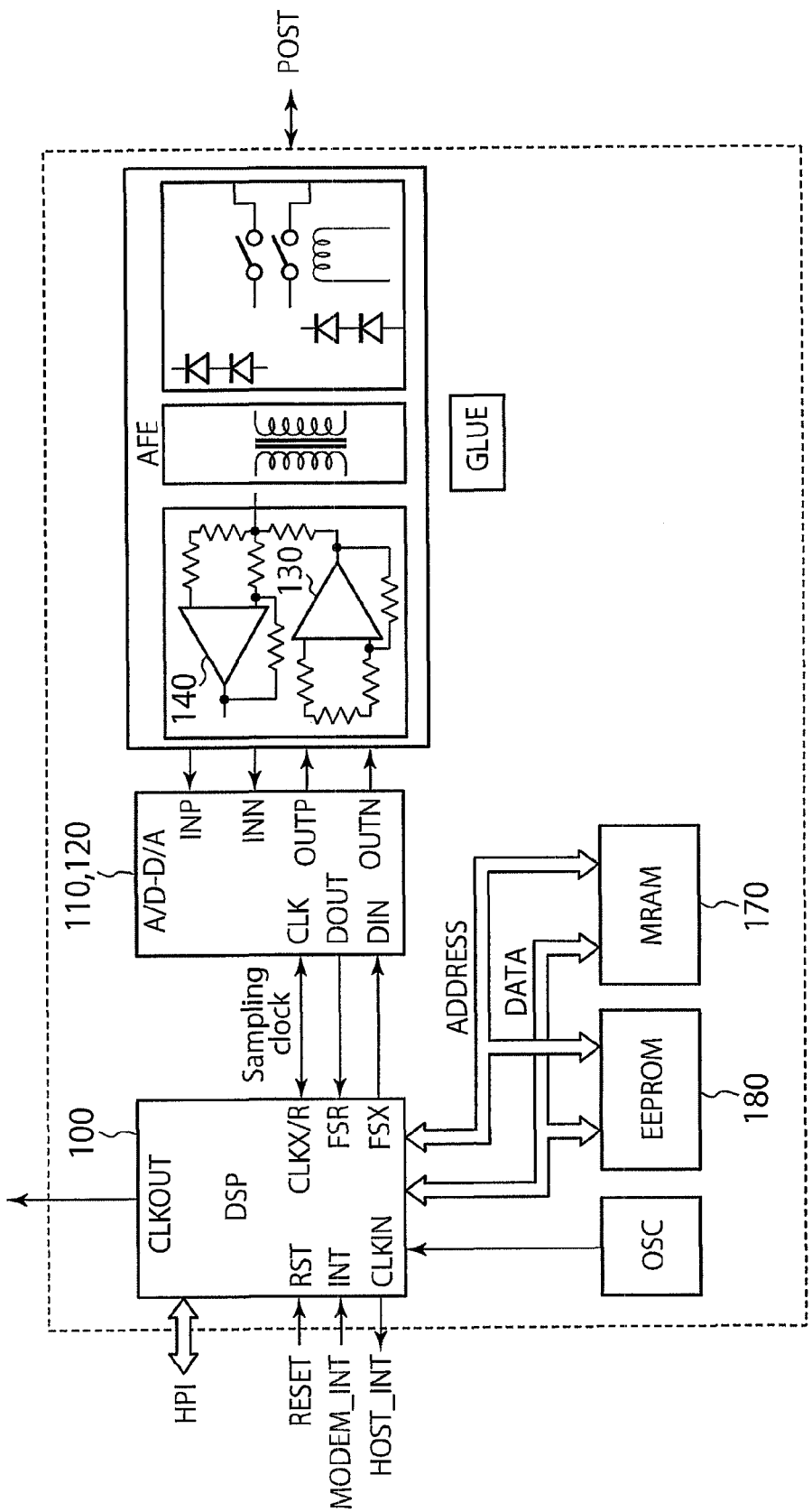
FIG. 12 is a block diagram of a digital subscriber line (DSL) data path unit of a DSL modem according to Example Application 1 of the MRAM.

FIG. 12 shows the DSL data path unit of a modem for digital subscriber lines (DSLs). The modem includes a programmable digital signal processor (DSP) 100, an analog-digital (A/D) converter 110, a digital-analog (D/A) converter 120, a transmission driver 130, and a receiver amplifier 140.

In FIG. 12, no band-pass filters are shown. Instead, a MRAM 170 according to the sixth embodiment and an EEPROM 180 are shown as memories for various options that store line code programs (programs that are to be executed by the DSP to select and operate the modem in accordance with coded subscriber line information, transmission conditions, and the like (line codes: QAM, CAP, RSK, FM, AM, PAM, DWMT, and the like).

In this example application, the two kinds of memories, the MRAM 170 and the EEPROM 180, are used as the memories to store the line code programs. However, the EEPROM 180 can be replaced with a MRAM. That is, only MRAMs can be used, instead of the two kinds of memories.

Example Application 2

Figure 13:
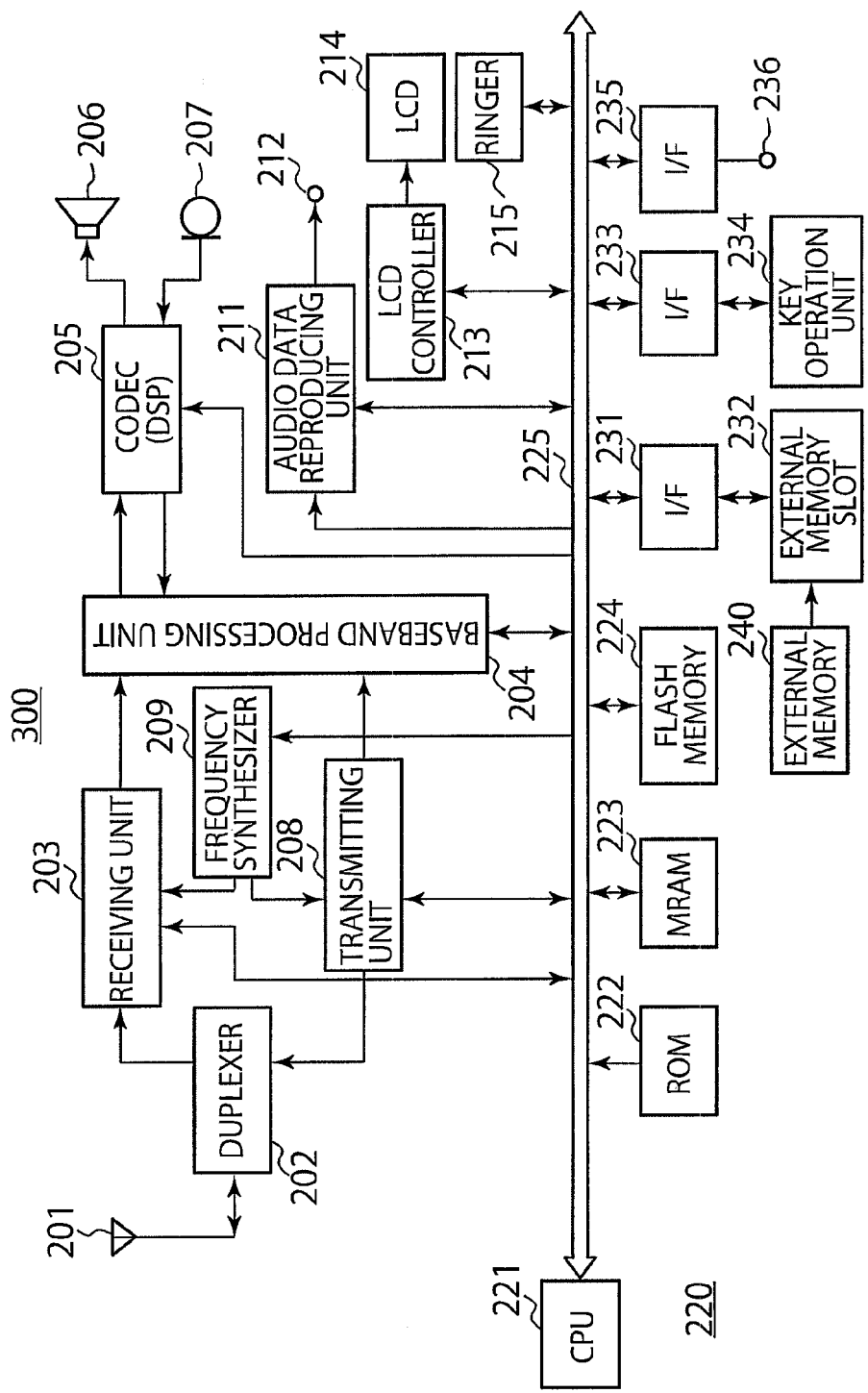
FIG. 13 is a block diagram of a mobile phone terminal 300 according to Example Application 2 of the MRAM.

FIG. 13 shows a mobile phone terminal 300 as another example application. The communication unit 200 that realizes communication functions includes a transmission/reception antenna 201, an antenna duplexer 202, a receiving unit 203, a baseband processing unit 204, a DSP (digital signal processor) 205 to be used as an audio codec, a speaker (a receiver) 206, a microphone (a transmitter) 207, a transmitting unit 208, and a frequency synthesizer 209.

The mobile phone terminal 300 also includes a control unit 220 that controls the respective components of the mobile phone terminal 300. The control unit 220 is a microcomputer formed by connecting a CPU 221, a ROM 222, a MRAM 223 according to the sixth embodiment, and a flash memory 224 via a bus 225. The programs to be executed by the CPU 221 and the necessary data such as display fonts are stored beforehand in the ROM 222.

The MRAM 223 is used mainly as the work area. Specifically, the MRAM 223 is used when data being calculated by the CPU 221 needs to be stored in the middle of execution of a program, or when data being exchanged between the control unit 220 and the respective components is temporarily stored, for example. The flash memory 224 stores the set conditions of the previous operation even when the power of the mobile phone terminal 300 is switched off, and stores the set parameters for use in a case where the same settings as those of the previous operation are used when the power is switched on next time. With this arrangement, the stored set parameters are not lost even when the power of the mobile phone terminal 300 is switched off.

The mobile phone terminal 300 also includes an audio data reproducing unit 211, an external output terminal 212, a LCD controller 213, a LCD (liquid crystal display) 214 for displaying, and a ringer 215 that generates the beeping sound. The audio data reproducing unit 211 reproduces audio data that is input to the mobile phone terminal 300 (or the audio information (audio data) stored in the later described external memory 240). The reproduced audio data (audio information) is transmitted to a headphone or a mobile speaker or the like via the external output terminal 212. In this manner, the reproduced audio data can be retrieved outside.

With the audio data reproducing unit 211, audio information can be reproduced as described above. The LCD controller 213 receives display information from the CPU 221 via the bus 225, transforms the display information into LCD control information for controlling the LCD 214, and drives the LCD 214 to perform displaying, for example.

The mobile phone terminal 300 further includes interface circuits (I/F) 231, 233, and 235, an external memory 240, an external memory slot 232, a key operation unit 234, and an external input/output terminal 236. An external memory 240 such as a memory card is inserted into the external memory slot 232. The external memory slot 232 is connected to the bus 225 via the interface circuit (I/F) 231.

As the slot 232 is provided in the mobile phone terminal 300 as described above, the information stored in the mobile phone terminal 300 can be written into the external memory 240, and the information (such as audio information) stored in the external memory 240 can be input to the mobile phone terminal 300.

The key operation unit 234 is connected to the bus 225 via the interface circuit (I/F) 233. Key input information that is input from the key operation unit 234 is transferred to the CPU 221, for example. The external input/output terminal 236 is connected to the bus 225 via the interface circuit (I/F) 235. The external input/output terminal 236 functions as the terminal that is used when various kinds of information are input from the outside to the mobile phone terminal 300 or when information is output from the mobile phone terminal 300 to the outside.

In this example application, the ROM 222, the MRAM 223, and the flash memory 224 are used. However, the flash memory 224 can be replaced with a MRAM, and the ROM 222 can also be replaced with a MRAM.

Example Application 3

Figure 14:
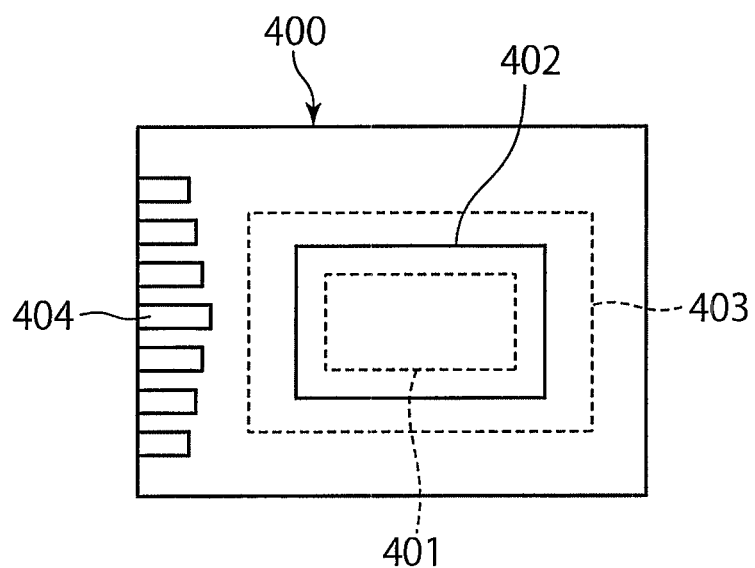
FIG. 14 is a top view of an MRAM card 400 according to Example Application 3 of the MRAM.

FIGS. 14 through 18 each show an example case where an MRAM is used in a card (a MRAM card) that stores content of media such as smart media. As shown in FIG. 14, a MRAM chip 401 is housed in a MRAM card main unit 400. In the card main unit 400, an opening 402 is formed at a location corresponding to the MRAM chip 401, so that the MRAM chip 401 is exposed. A shutter 403 is provided to cover the opening 402, and the MRAM chip 401 is protected by the shutter 403 when the MRAM card is being carried around. The shutter 403 is made of a material that can shield external magnetic fields, such as ceramics.

When data is transferred, the shutter 403 is released, and the MRAM chip 401 is exposed. An external terminal 404 is used to retrieve the content data from the MRAM card to the outside.

Figure 15:
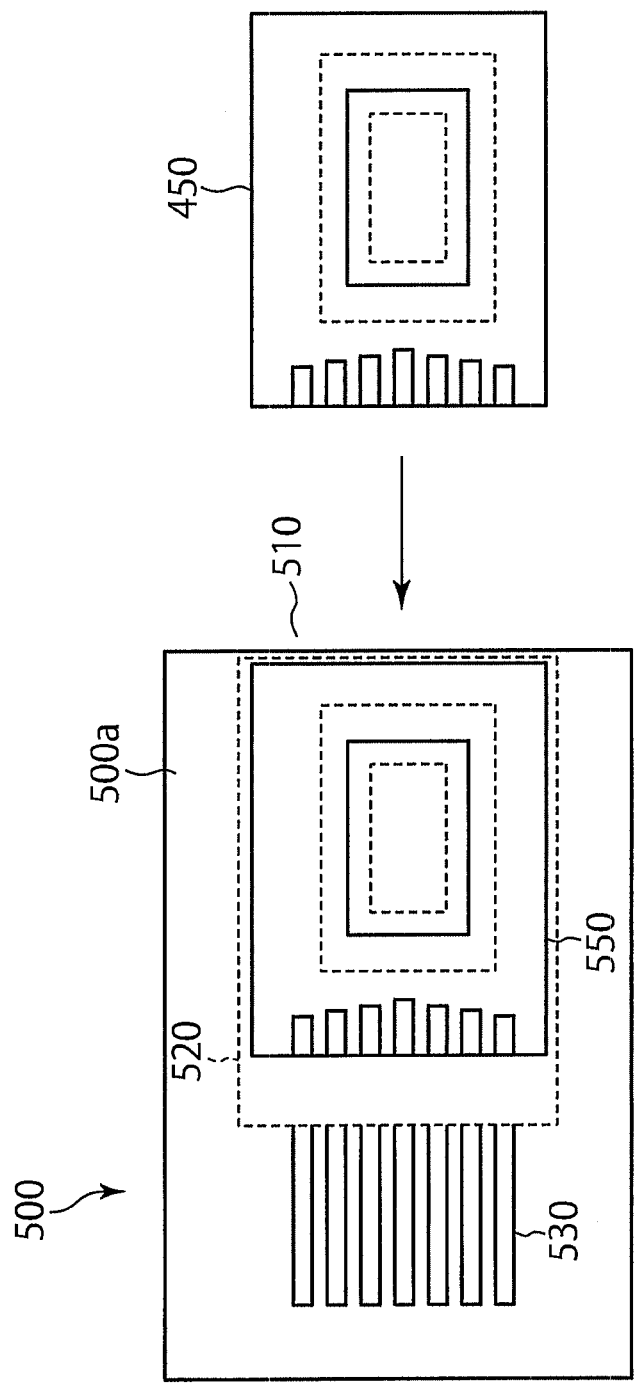
FIG. 15 is a plan view of a data transfer device 500 that transfers data onto an MRAM card.
Figure 16:
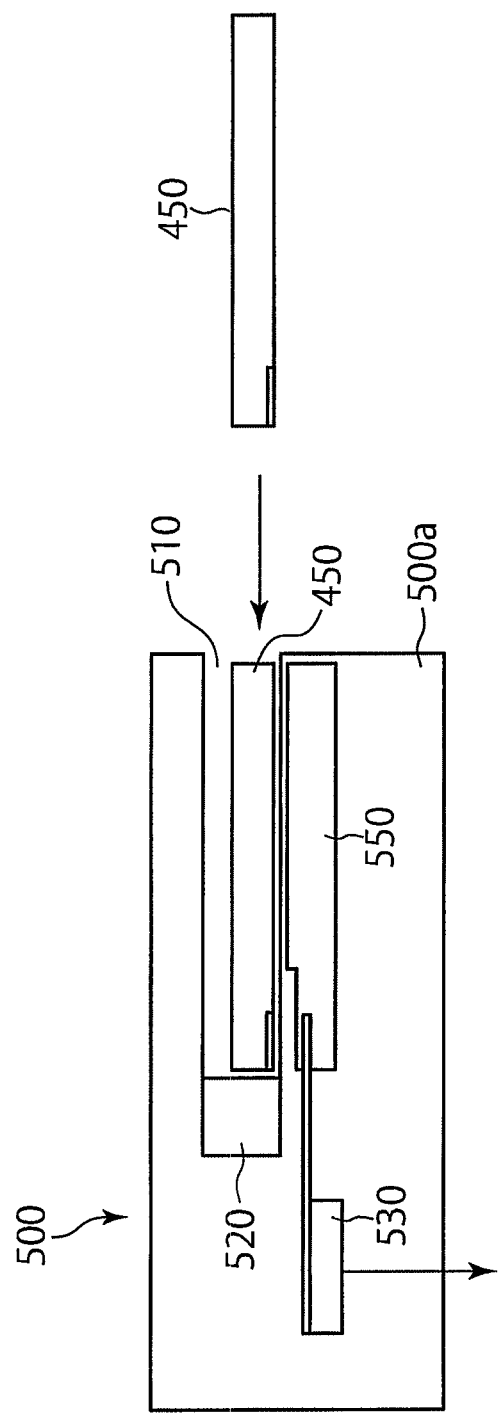
FIG. 16 is a cross-sectional view of the data transfer device 500 that transfers data onto an MRAM card.

FIGS. 15 and 16 show a top view and a cross-sectional view of a transfer device of a card insertion type for transferring data to a MRAM card. A data transfer device 500 includes a housing 500a. A first MRAM card 550 is housed in the housing 500a. The housing 500a has an external terminal 530 electrically connected to the first MRAM card 550, and the data stored in the first MRAM card 550 is rewritten with the use of the external terminal 530.

A second MRAM card 450 used by an end user is inserted into an insertion portion 510 of the transfer device 500 as indicated by the arrow, and is pushed until stopped by a stopper 520. The stopper 520 also functions as the member for positioning the first MRAM card 550 and the second MRAM card 450. When the second MRAM card 450 is set in a predetermined position, a control signal is supplied from a first MRAM data rewrite controller to the external terminal 530, and the data stored in the first MRAM card 550 is transferred to the second MRAM card 450.

Figure 17:
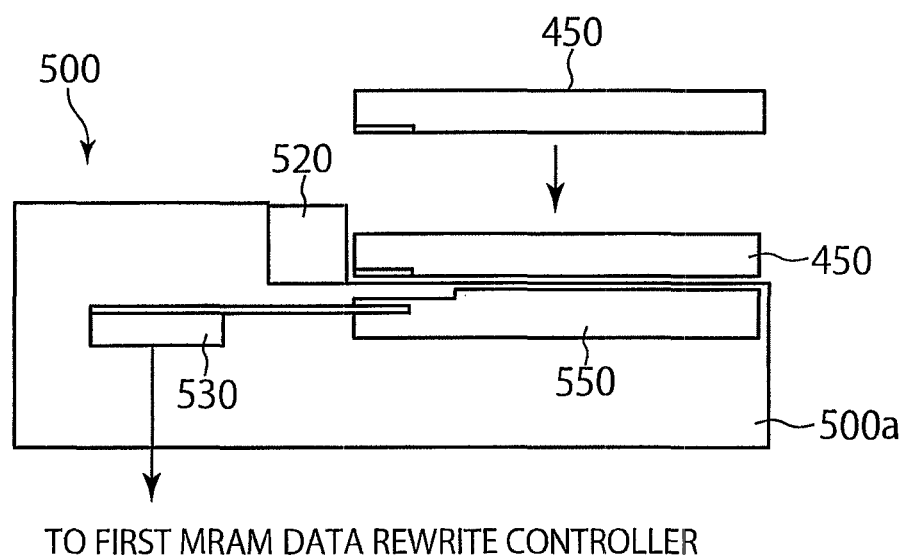
FIG. 17 is a cross-sectional view of a data transfer device 500 of a set-in type that transfers data onto an MRAM card.

FIG. 17 is a cross-sectional view showing a data transfer device of a set-in type. In the data transfer device 500, the second MRAM card 450 is placed on the first MRAM card 550 in a set-in manner as indicated by the arrow, with the stopper 520 serving as the mark. The transfer method is the same as the method used in the transfer device of the card insertion type, and therefore, explanation thereof is not repeated herein.

Figure 18:
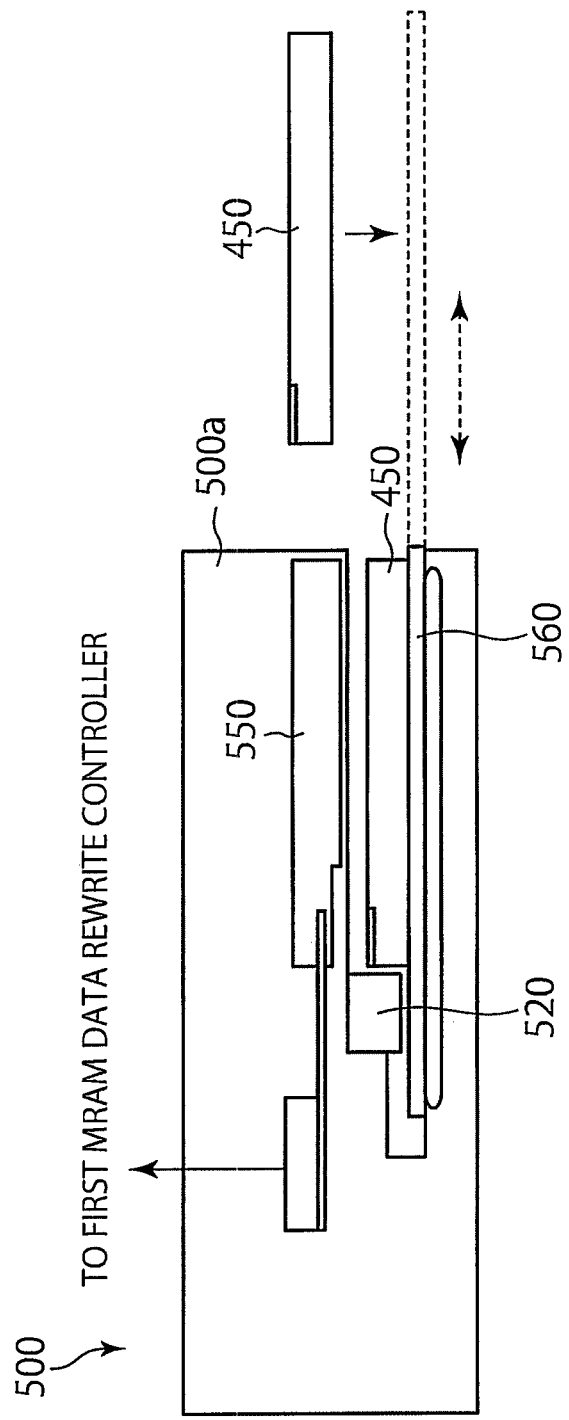
FIG. 18 is a cross-sectional view of a data transfer device 500 of a sliding type that transfers data onto an MRAM card.

FIG. 18 is a cross-sectional view showing a data transfer device of a sliding type. Like a CD-ROM drive or a DVD drive, the data transfer device 500 includes a sliding tray 560, and the sliding tray 560 moves as indicated by the arrows. When the sliding tray 560 is moved to the position shown by the dashed line, the second MRAM card 450 is placed on the sliding tray 560, and the second MRAM card 450 is transported into the transfer device 500.

The top end of the second MRAM card 450 being transported is brought into contact with the stopper 520 in the same manner as in the transfer device of the card insertion type. Also, the transfer method is the same as the method used in the transfer device of the card insertion type, and therefore, explanation thereof is not repeated herein.

The present invention is not limited to the above described embodiments, and modifications may be made to the components, without departing from the scope of the invention. Further, various inventions may be made by appropriately combining the components disclosed in the above embodiments. For example, some of the components may be omitted from the components disclosed in the embodiments, or components of different embodiments may be appropriately combined.

The invention claimed is:

1. A magnetoresistive element comprising:
a base layer including a first layer made of a perovskite conductive oxide that is made of $ABO_3$ and is oriented to a (002) plane, a site A being formed with at least one element selected from the group consisting of Sr, Ce, Dy, La, K, Ca, Na, Pb, and Ba, a site B being formed with at least one element selected from the group consisting of Ti, V, Cr, Mn, Fe, Co, Ni, Ga, Nb, Mo, Ru, Ir, Ta, Ce, and Pb;
a first magnetic layer formed on the base layer and having a changeable magnetization direction with an easy axis of magnetization in a direction perpendicular to a film plane;
a first nonmagnetic layer formed on the first magnetic layer; and
a second magnetic layer formed on the first nonmagnetic layer and having a fixed magnetization layer with an easy axis of magnetization in a direction perpendicular to the film plane,
the first magnetic layer including a ferrimagnetic layer having a $DO_{22}$ structure, the ferrimagnetic layer having a c-axis oriented in a direction perpendicular to the film plane and being an alloy layer containing Mn and Ga, the magnetization direction of the first magnetic layer being changeable by a current flowing through the first magnetic layer, the first nonmagnetic layer, and the second magnetic layer.

2. The magnetoresistive element according to claim 1, wherein the base layer further includes a second layer that is formed on a first layer and contains a metal having a tetragonal structure or a cubic structure, the metal being oriented to a (001) plane.

3. The magnetoresistive element according to claim 1, further comprising:
a second nonmagnetic layer formed on the second magnetic layer; and
a third magnetic layer formed on the second nonmagnetic layer, having an easy axis of magnetization in a direction perpendicular to a film plane, and having a magnetization direction antiparallel to the magnetization direction of the second magnetic layer, wherein the relationship, $M_{S2} \times t_2 < M_{S3} \times t_3$, is satisfied, where $M_{S2}$ represents saturation magnetization of the second magnetic layer, $t_2$ represents a film thickness of the second magnetic layer, $M_{S3}$ represents saturation magnetization of the third magnetic layer, and $t_3$ represents a film thickness of the third magnetic layer.

4. The magnetoresistive element according to claim 1, further comprising a first interfacial layer formed between the second magnetic layer and the first nonmagnetic layer, wherein the first interfacial layer is made of an alloy $(Co_{100-x}Fe_x)_{100-y}B_y$ (x≥20 atomic %, 0<y≤30 atomic %).

5. The magnetoresistive element according to claim 1, further comprising a second interfacial layer formed between the first magnetic layer and the first nonmagnetic layer, wherein the second interfacial layer is made of an alloy $(Co_{100-x}Fe_x)_{100-y}B_y$ (x≥20 atomic %, 0<y≤30 atomic %).

6. The magnetoresistive element according to claim 5, wherein the second interfacial layer is a cubic structure or a tetragonal structure, and is oriented to a (100) plane.

7. A magnetic memory comprising:

the magnetoresistive element according to claim 1; and memory cells that are positioned to sandwich the magnetoresistive element, the memory cells including first and second electrodes for energizing the magnetoresistive element.

* * * * *